United States Patent
Lin

(10) Patent No.: US 7,724,499 B2
(45) Date of Patent: May 25, 2010

(54) ELECTROLYTE TRANSISTOR

(75) Inventor: Cha-Hsin Lin, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 134 days.

(21) Appl. No.: 12/110,363

(22) Filed: Apr. 28, 2008

(65) Prior Publication Data

US 2009/0122465 A1    May 14, 2009

(30) Foreign Application Priority Data

Nov. 13, 2007   (TW) .............................. 96142832 A

(51) Int. Cl.
*H01G 9/00*    (2006.01)
(52) U.S. Cl. ............... 361/434; 257/288; 257/E29.255; 257/E21.409; 438/197; 204/230.5
(58) Field of Classification Search ................. 361/434; 204/230.5; 257/288, E29.255, E21.409; 438/197
See application file for complete search history.

(56) References Cited

U.S. PATENT DOCUMENTS

| 6,806,511 | B2 | 10/2004 | Armgarth et al. |
| 7,012,306 | B2 | 3/2006 | Armgarth et al. |
| 2003/0111670 | A1* | 6/2003 | Misra et al. .................. 257/200 |
| 2005/0062097 | A1* | 3/2005 | Misra et al. .................. 257/324 |
| 2007/0138463 | A1* | 6/2007 | Herlogsson et al. ........... 257/40 |
| 2008/0012007 | A1* | 1/2008 | Li et al. ........................ 257/40 |
| 2009/0065059 | A1* | 3/2009 | Rasmussen et al. ......... 136/263 |

FOREIGN PATENT DOCUMENTS

| CN | 1496491 | 5/2004 |
| CN | 1559090 | 12/2004 |

OTHER PUBLICATIONS

"1st Office Action of China counterpart application", issued on Sep. 11, 2009, p. 1-p. 6.

* cited by examiner

*Primary Examiner*—Victor A Mandala
(74) *Attorney, Agent, or Firm*—Jianq Chyun IP Office

(57) ABSTRACT

Electrolyte transistor including a gate structure, two sources/drains, an electrolyte layer and a buried conductive layer is provided. The gate structure including a gate dielectric layer and a gate is located above a substrate. The two sources/drains are separated from each other and located above the substrate on each side the gate structure. The electrolyte layer is located between and contacts the two sources/drains, and located between and contacts the gate structure and the substrate. The buried conductive layer is located between the electrolyte layer and the substrate. The electrolyte layer between the two sources/drains includes a channel. The conductivity of the electrolyte layer between the two sources/drains is changed by a redox reaction, so as to turn on or turn off the channel.

19 Claims, 2 Drawing Sheets

ELECTROLYTE TRANSISTOR

CROSS-REFERENCE TO RELATED APPLICATION

This application claims the priority benefit of Taiwan application serial no. 96142832, filed on Nov. 13, 2007. The entirety the above-mentioned patent application is hereby incorporated by reference herein and made a part of specification.

BACKGROUND OF THE INVENTION

1. Field of the Invention

The present invention generally relates to a transistor and a method of fabricating the same, in particular, to an electrolyte transistor and a method of fabricating the same.

2. Description of Related Art

Transistor is the most basic electronic element in the semiconductor process. A metal-oxide-semiconductor field-effect transistor (MOSFET) is one of the typical transistors. The MOSFET has a structure similar to a capacitor formed by sequentially stacking metal/oxidation layer/semiconductor together. The MOSFET is formed on a hard silicon substrate, so it has a higher cost, and it is greatly limited on application.

Currently, in some researches, a semiconductor polymer is used to fabricate an organic field effect transistor. The organic field effect transistor uses the semiconductor polymer as a channel, and its working principle is that an external electric field is applied to change the characteristics of the charged carrier in the semiconductor polymer. The organic field effect transistor has advantages that it has desirable mechanical property at a lower temperature (<100° C.), and the entire weight of the element is much lighter than that of the conventional transistor. Furthermore, the fabrication cost is relatively low, and the fabricating time is relatively short as well. In addition, the organic field effect transistor may be used for fabricating an element with a large area, and may be applied to flexible electronic elements.

Another kind of transistor is an electrochemical transistor element, which uses electrochemical redox reaction of organic materials to achieve the function. The organic material in the electrochemical transistor element mainly includes electrolyte and conductive polymers, which can be converted between an oxidation state and a reduction state. In other words, the organic material at least has two states, one is the reduction state with a low conductivity; and the other is the oxidation state with the conductivity higher than that of the former state. Such element may be applied to a sensor through utilizing the differences of the conductivity, for example, to sense an oxidation situation of a solution. However, such element generally has a higher fabrication cost, and the fabricating process is more difficult, so it is difficult to be fabricated.

SUMMARY OF THE INVENTION

Accordingly, the present invention is related to an electrolyte transistor, which includes a gate structure, two sources/drains, an electrolyte layer, and a buried conductive layer. The gate structure including a gate dielectric layer and a gate is located above a substrate. The two sources/drains are separated from each other and located above the substrate on each side of the gate structure. The electrolyte layer is located between and contacts the two sources/drains, and located between and contacts the gate structure and the substrate. The buried conductive layer is located between the electrolyte layer and the substrate. The electrolyte layer between the two sources/drains has a channel, and the conductivity is changed by a redox reaction of the electrolyte layer, so as to turn on or turn off the channel.

The present invention is related to a method of fabricating an electrolyte transistor. The method includes the following steps. Firstly, a buried conductive layer is formed on a substrate. Next, a dielectric layer is formed on the substrate, and the dielectric layer has an opening exposing the buried conductive layer. Then, a source/drain is respectively formed on the dielectric layer on each side of the opening. Then, an electrolyte layer is formed between the two sources/drains. Then, a gate dielectric layer and a gate are formed on the electrolyte layer, so as to constitute the gate structure.

The electrolyte transistor of the present invention may be fabricated by a flexible substrate, and the fabricating process is quite simple, which thus is suitable for mass production.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
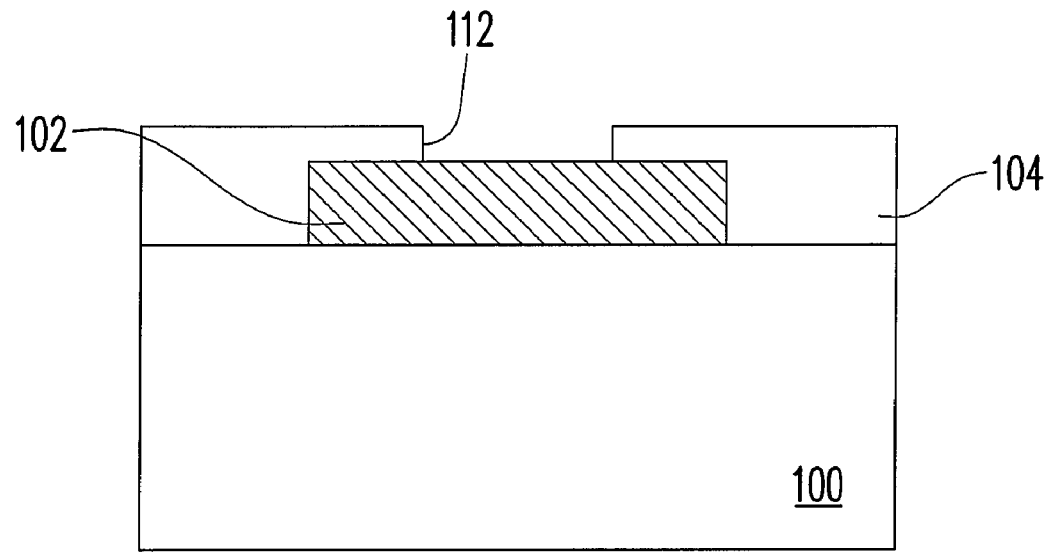
FIGS. 1A to 1D are schematic cross-sectional views of a flow for fabricating an electrolyte transistor according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIGS. 1A to 1D are schematic cross-sectional views of a flow for fabricating an electrolyte transistor according to an embodiment of the present invention.

Referring to FIG. 1A, a buried conductive layer 102 is formed on a substrate 100. The substrate 100 may be a hard substrate or a flexible substrate. The hard substrate is for example a semiconductor substrate, such as silicon substrate; a semiconductor compound substrate, such as silicon-germanium substrate; and an insulating substrate, such as glass or silicon-on-insulator (SOI) substrate. The flexible substrate is for example plastic substrate, such as polyethylene terephthalate (PET), poly(ethylene naphthalene-2,6-dicarboxylate) (PEN), polyethylene, polypropylene, polycarbonate; paper; coated paper with the coating layer as for example resin, polypropylene, or polystyrene; corrugated board; or paper laminate. The material of the buried conductive layer 102 is for example metal, metal alloy, or metal nitride, including aluminium, gold, silver, copper, tungsten, nickel, copper-aluminium alloy, titanium nitride, tantalum nitride, molybdenum nitride or any combination thereof. The buried conductive layer 102 may be formed by an ink jet printing technique. Additionally, the buried conductive layer 102 may also be formed by means of the following way: firstly, a blanket buried conductive material layer is formed by an electroplating or vapour deposition manner, and then the blanket buried conductive material layer is patterned by lithography and etching processes. The vapour deposition process includes chemical vapour deposition or physical vapour deposition, for example sputtering or evaporation.

Next, referring to FIG. 1A, a dielectric layer 104 is formed on the substrate 100. The dielectric layer 104 has an opening 112 exposing the buried conductive layer 102. The material of the dielectric layer 104 is for example polymer, such as poly(vinyl pyrrolidone) (PVP), silica, tetraethoxysilane (TEOS) oxide, un-doped silicon glass (FSG), phosphosilicate glass (PSG), borophosilicate glass (BPSG), fluorin-doped silicate glass (FSG), spin-on glass (SOG), silicon nitride, or dielectric layer with a dielectric constant lower than 4. The dielectric layer 104 may be formed by a manner the same as or different from that of the buried conductive layer 102. The dielectric layer 104 may be formed through, for example, an ink jet printing technique, so as to directly form the dielectric layer 104 having the opening 112. Additionally, the dielectric layer 104 may also be formed by means of the following way: firstly, a blanket dielectric material layer is formed by a chemical vapour deposition technique or spin coating technique, and then the blanket dielectric material layer is patterned via the lithograph and etching processes, so as to form the dielectric layer 104 having the opening 112.

Figure 1B:
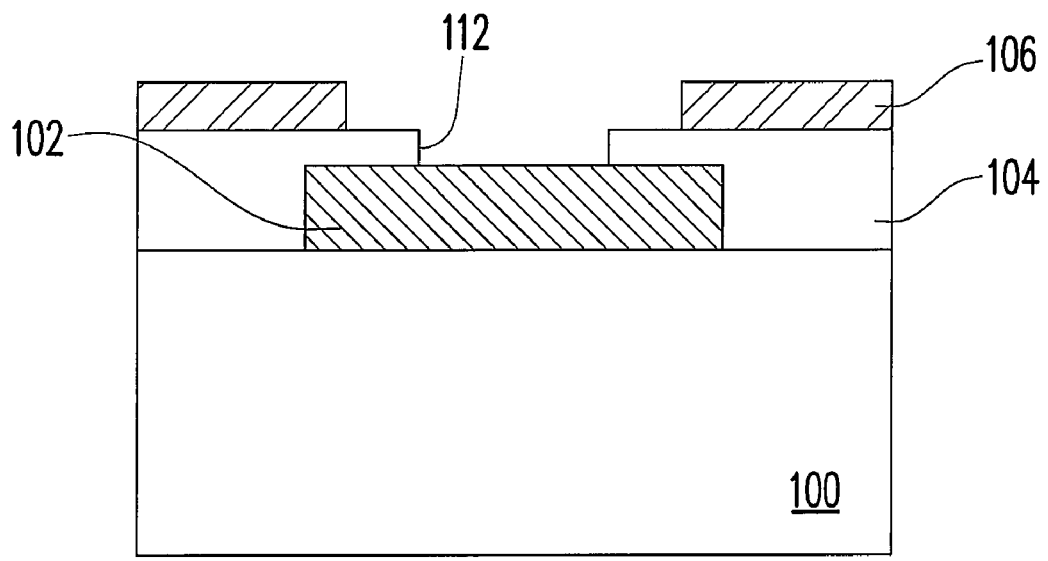

Next, referring to FIG. 1B, a source/drain 106 is respectively formed on the dielectric layer 104 on each side of the opening 112. The material of the source/drain 106 may be the same as or different from that of the buried conductive layer 102. The material of the source/drain 106 is, for example, aluminium, silver, gold, platinum, copper, copper-aluminium alloy, tungsten, nickel, titanium nitride, tantalum nitride, molybdenum nitride, or any combination thereof. The source/drain 106 may be formed through a manner the same as or different from that of the buried conductive layer 102 or the dielectric layer 104. The source/drain 106 may be directly formed by an ink jet printing technique. Additionally, the source/drain 106 may be formed by means of the following way: firstly, a blanket conductive material layer is formed via an electroplating or vapour deposition manner, and then the blanket conductive material layer is patterned by the lithography and etching processes. The vapour deposition process includes chemical vapour deposition or physical vapour deposition, for example, sputtering or evaporation.

Figure 1C:
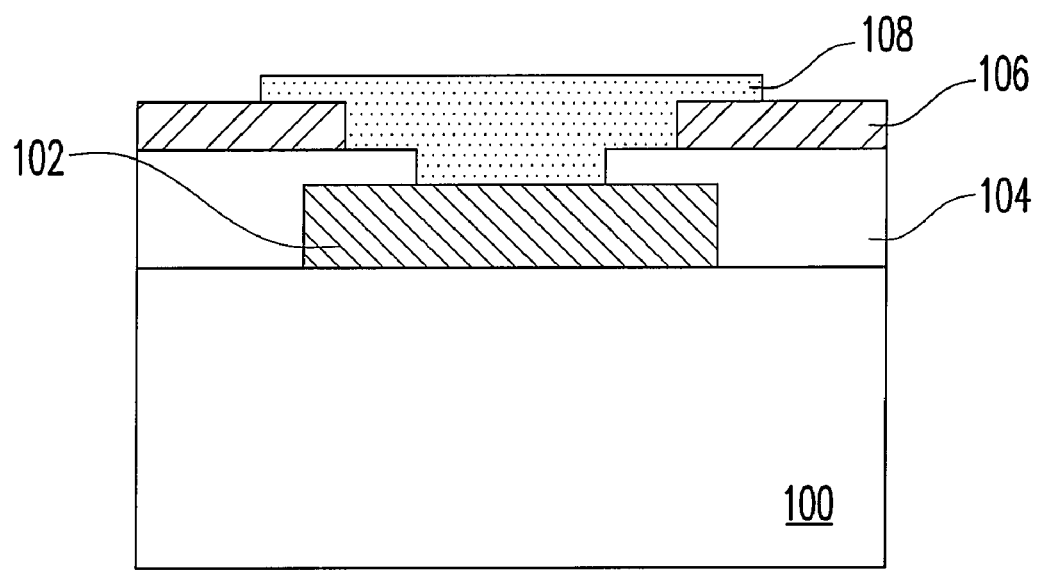

Next, referring to FIG. 1C, an electrolyte layer 108 is formed between the two sources/drains 106, so as to electrically connect the buried conductive layer 102 to the two sources/drains 106. The material of the electrolyte layer 108 is, for example, solidified electrolyte. The solidified electrolyte is, for example, GeSe, GeS, AgTeSe, AgTeS, or AgSeS doped with silver, copper, chromium, or niobiumor an organic material. The organic material has the ability of electrochemically altering its electrical conductivity through change of redox state thereof. The organic material is a polymer material which is electrically conducting in at least one oxidation state and optionally further comprises a polyanion compound. In an embodiment, the polymer material is selected from the group consisting of polythiophenes, polypyrroles, polyanilines, polyisothianaphtalenes, polyphenylene vinylenes and copolymers thereof. In a specific embodiment, the polymer material is a polymer or copolymer of a 3,4-dialkoxythiophene, wherein the two alkoxy groups may be the same or different or together represent an optionally substituted oxy-alkylene-oxy bridge. In a specific embodiment, 3,4-dialkoxythiophene is selected from the group consisting of poly(3,4-methylenedioxythiophene), poly(3,4-ethylenedioxythiophene, poly(3,4-propylenediox-ythiophene), and poly(3,4-butylenedioxythiophene). Polyanion compound is poly(styrene sulkphonc acid) or a salt thereof.

The solidified electrolyte further comprises a binder. The binder has gelling properties. The binder is selected from the group consisting of gelatine, a gelatine derivative, polyacrylic acid, polymethacrylic acid, poly(vinyl-pyrrolidone), polysaccharides, polyacrylamides, polyurethanes, polypropylene oxides, polyethylene oxides, poly-(styrene sulphonic acid) and poly(vinyl alcohol) and salts and copolymers thereof; and may optionally be cross-linked. The solidified electrolyte further includes an ionic salt. The solidified electrolyte further contains a hygroscopic salt such as magnesium chloride to maintain the water content therein. The electrolyte layer 108 may be formed through a manner the same as or different from that of the source/drain 106, the buried conductive layer 102, or the dielectric layer 104. The electrolyte layer 108 may be directly formed by an ink jet printing technique, so as to cover the electrolyte layer 108 between the two sources/drains 106 and on a part of the two sources/drains 106. Additionally, the electrolyte layer 108 may be formed by means of the following way: firstly, a blanket electrolyte material layer is formed through a physical vapour deposition process, for example sputtering or evaporation, and then the blanket electrolyte material layer is patterned by lithography and etching processes.

Figure 1D:
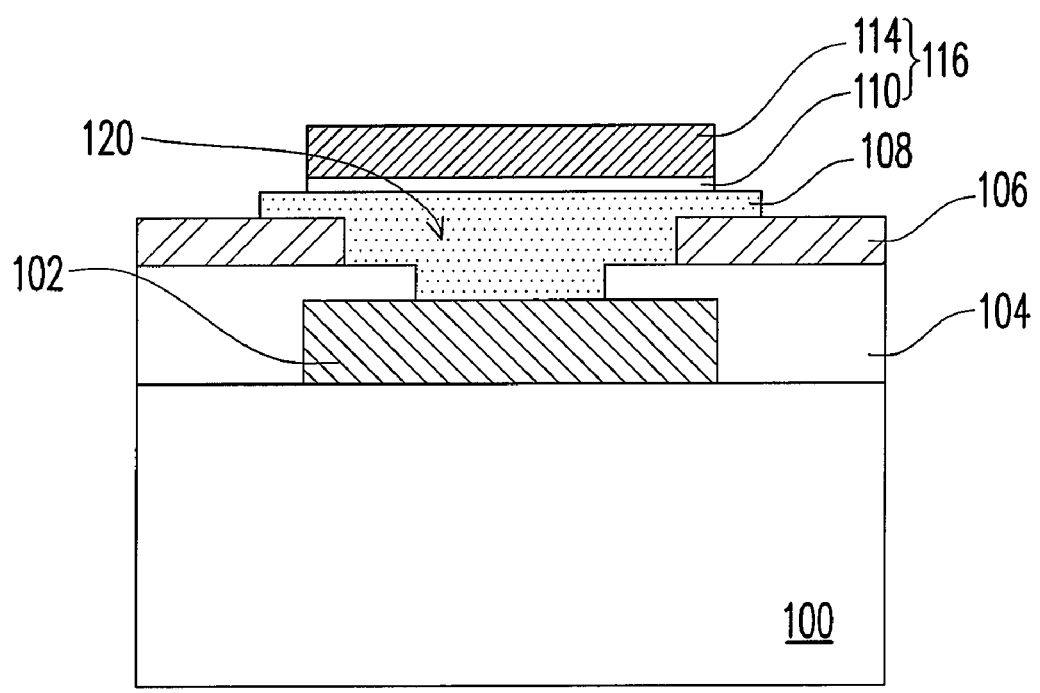

Then, referring to FIG. 1D, a gate structure 116 is formed on the electrolyte layer 108. The gate structure 116 includes a gate dielectric layer 110 and a gate 114. The material of the gate dielectric layer 110 is for example silicon oxide, silicon nitride, silicon oxynitride, or another material with a high dielectric constant. The gate dielectric layer 110 may be formed through a manner the same as or different from that of the source/drain 106, the buried conductive layer 102, or the dielectric layer 104. The gate dielectric layer 110 may be formed through, for example, an ink jet printing technique, spin-coating technique, thermal oxidation process, or chemical vapour deposition process. The material of the gate 114 may be the same as or different from that of the source/drain 106 and the buried conductive layer 102, which is for example aluminium, silver, gold, platinum, copper, copper-aluminium alloy, tungsten, nickel, titanium nitride, tantalum nitride, molybdenum nitride, or any combination thereof. The gate 114 may be formed by a way the same as or different from that of the gate dielectric layer 110, the source/drain 106, the buried conductive layer 102, or the dielectric layer 104. The gate 114 can be directly formed by an ink jet printing technique. Additionally, the gate 114 may be formed by means of the following way: firstly, a blanket conductive material layer is formed via an electroplating or vapour deposition process, and then the blanket conductive material layer is patterned by lithography and etching processes. The vapour deposition process includes chemical vapour deposition, or physical vapour deposition, for example, sputtering or evaporation.

In an embodiment, the gate 114 and the gate dielectric layer 110 are both formed by an ink jet printing technique, which does not require the lithography and etching processes at all, so the fabricating process is quite simple and fast.

In the embodiment of the present invention, the electrolyte layer 108 between the two sources/drains 106 may serve as a channel 120, and the conductivity is changed by a redox reaction of the electrolyte layer 108, so as to turn on or turn off the channel 120. In an embodiment, the device is a depletion mode transistor, when no bias is applied to the gate 114, the electrolyte layer 108 is at an oxidation state with a high conductivity. When a positive voltage is applied to the gate 114 of the device, the electrolyte layer 108 below the gate 114 is reduced to a reduction state with a low conductivity. In other words, when no bias is applied to the gate 114, the buried conductive layer 102 is grounded or floated, and a voltage difference exists between the two sources/drains 106, the channel region between the sources/drains 106 is turned on. When a positive voltage is applied to the gate 114, the buried conductive layer 102 is grounded, the source 106 is grounded, and a positive voltage is applied to the drain 106, electrons are provided to the electrolyte layer 108 below the gate 114 from the grounded or floated buried conductive layer 102, such that the electrolyte layer 108 is reduced to the reduction state with the low conductivity, such that the channel is turned off. The source for supplying electrons is located right under the channel, so as to effectively shorten the electron migrate length. On the other hand, since the buried conductive layer 102 may be connected to the source 106 of the transistor, once the device is operated, a potential difference is naturally generated between the gate 114 and the buried conductive layer 102, such that charges are internally transferred within the electrolyte. Therefore, in the present invention, the response speed of the transistor may be greatly improved through the shortened electron migrate length and the naturally-generated potential different.

In an embodiment of the present invention, since the buried conductive layer may be connected to the source of the transistor, once the element device is operated, a potential difference is naturally generated between the gate and the buried conductive layer, such that no additional negative power source is required to be provided to the buried conductive layer during the operation.

On the other aspect, the electrolyte transistor in an embodiment of the present invention has a vertical structure, the charges may be supplied to the electrolyte in the channel region between the two sources/drains on time, such that the electrolyte quickly performs the redox reaction, and thus, the transistor has a high response speed.

As for the electrolyte transistor in an embodiment of the present invention, the redox state in the electrolyte is changed only when a bias is applied, and after the bias is removed, the moving electrons and moving ions within the electrolyte both return to the initial state once again. Therefore, the electrolyte transistor in an embodiment of the present invention can be applied to dynamic electrolyte transistors or bi-stable electrolyte transistors.

The electrolyte transistor in an embodiment of the present invention may be fabricated by a flexible substrate, the fabricating process is quite simple, which thus is suitable for mass production.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrolyte transistor, comprising:
   a gate structure, comprising a gate dielectric layer and a gate, located above a substrate;
   two sources/drains, separated from each other and located above the substrate on each side of the gate structure;
   an electrolyte layer, located between and contacting the two sources/drains, and located between the gate structure and the substrate; and
   a buried conductive layer, located between the electrolyte layer and the substrate,
   wherein the electrolyte layer between the two sources/drains comprises a channel, and a conductivity of the electrolyte layer is changed by a redox reaction, so as to turn on or turn off the channel.

2. The electrolyte transistor according to claim 1, wherein a material of the electrolyte layer comprises solidified electrolyte.

3. The electrolyte transistor according to claim 2, wherein the solidified electrolyte comprises GeSe, GeS, AgTeSe, AgTeS, or AgSeS doped with silver, copper, chromium, or niobium, or an organic material having the ability of electrochemically altering its electrical conductivity through change of redox state thereof.

4. The electrolyte transistor according to claim 3, wherein the organic material is a polymer material.

5. The electrolyte transistor according to claim 4, wherein the polymer material is selected from the group consisting of polythiophenes, polypyrroles, polyanilines, polyisothianaphtalenes, polyphenylene vinylenes and copolymers thereof.

6. The electrolyte transistor according to claim 4, wherein the polymer material is a polymer or copolymer of a 3,4-dialkoxythiophene, wherein the two alkoxy groups may be the same or different or together represent an optionally substituted oxy-alkylene-oxy bridge.

7. The electrolyte transistor according to claim 6, wherein the polymer or copolymer of a 3,4-dialkoxythiophene is selected from the group consisting of poly(3,4-methylenedioxythiophene), poly(3,4-ethylenedioxythiophene, poly(3,4-propylenedioxythiophene), and poly(3,4-butylenedioxythiophene).

8. The electrolyte transistor according to claim 4, wherein the organic material further comprises a polyanion compound.

9. The electrolyte transistor according to claim 8, wherein the polyanion compound is poly(styrene sulkphonc acid) or a salt thereof.

10. The electrochemical transistor device according to claim 4, wherein the solidified electrolyte comprises a binder.

11. The electrochemical transistor device according to claim 10, wherein the binder is a gelling agent selected from the group consisting of gelatine, a gelatine derivative, polyacrylic acid, polymethacrylic acid, poly(vinylpyrrolidone), polysaccharides, polyacrylamides, polyurethanes, polypropylene oxides, polyethylene oxides, poly(styrene sulphonic acid) and poly(vinyl alcohol), and salts and copolymers thereof 12. The electrochemical transistor device according to claim 4, wherein the solidified electrolyte comprises an ionic salt.

13. The electrolyte transistor according to claim 2, further comprising a dielectric layer, for isolating the two sources/drains from the substrate.

14. The electrolyte transistor according to claim 1, further comprising a dielectric layer, for isolating the two sources/drains from the substrate.

15. The electrolyte transistor according to claim 1, wherein a material of the two sources/drains comprises aluminium, silver, gold, platinum, copper, copper/aluminium alloy, tungsten, nickel, titanium nitride, tantalum nitride, molybdenum nitride, or any combination thereof.

16. The electrolyte transistor according to claim 1, wherein a material of the gate comprises aluminium, silver, gold, platinum, copper, copper-aluminium alloy, tungsten, nickel, titanium nitride, tantalum nitride, molybdenum nitride, or any combination thereof.

17. The electrolyte transistor according to claim 1, wherein a material of the buried conductive layer comprises aluminium, silver, gold, platinum, copper, copper-aluminium alloy, tungsten, nickel, titanium nitride, tantalum nitride, molybdenum nitride, or any combination thereof.

18. The electrolyte transistor according to claim 1, wherein the electrolyte transistor is a depletion mode transistor.

19. The electrochemical transistor device according to claim 4, wherein the solidified electrolyte comprises an ionic salt.

* * * * *